(12) United States Patent
Kim

(10) Patent No.: US 10,347,864 B2
(45) Date of Patent: Jul. 9, 2019

(54) DISPLAY DEVICE

(71) Applicant: SAMSUNG DISPLAY CO., LTD., Yongin-si, Gyeonggi-do (KR)

(72) Inventor: Jae Hong Kim, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/831,555

(22) Filed: Dec. 5, 2017

(65) Prior Publication Data
US 2018/0198089 A1   Jul. 12, 2018

(30) Foreign Application Priority Data

Jan. 6, 2017 (KR) .................. 10-2017-0002479

(51) Int. Cl.
*H05K 1/00* (2006.01)
*H01L 51/52* (2006.01)
*H01L 27/32* (2006.01)

(52) U.S. Cl.
CPC ...... *H01L 51/5246* (2013.01); *H01L 51/5253* (2013.01); *H01L 51/5284* (2013.01); *H01L 27/323* (2013.01); *H01L 27/3276* (2013.01); *H01L 27/3288* (2013.01)

(58) Field of Classification Search
CPC .............. H01L 27/323; H01L 27/3276; H01L 27/3288; H01L 51/5246; H01L 51/5253; H01L 51/5284
See application file for complete search history.

(56) References Cited

U.S. PATENT DOCUMENTS

| | | | | |
|---|---|---|---|---|
| 2010/0321916 | A1* | 12/2010 | Yoshida | H05K 3/361 361/803 |
| 2011/0204465 | A1* | 8/2011 | Meng | H01L 27/14618 257/434 |
| 2015/0205022 | A1* | 7/2015 | Kim | B32B 37/1292 428/192 |
| 2017/0338429 | A1* | 11/2017 | Watabe | H01L 51/0097 |
| 2017/0351136 | A1* | 12/2017 | Banjouya | H01L 51/0024 |
| 2018/0183001 | A1* | 6/2018 | Lee | H01L 51/5246 |

FOREIGN PATENT DOCUMENTS

KR   10-2015-0088093 A   7/2015

* cited by examiner

*Primary Examiner* — Yuriy Semenenko
(74) *Attorney, Agent, or Firm* — Lee & Morse, P.C.

(57) ABSTRACT

A display device includes a display device, a window, and an adhesive material. The display panel includes a display area and a non-display area. The window is on the display panel. The adhesive material is between the display panel and the window. The window includes a base substrate and a blocking barrier. The base substrate includes a first area overlapping the display area, a second area overlapping the non-display area, and a third area protruding outwardly from the display panel. The blocking barrier is on the second area of the base substrate, includes convex patterns and an inner surface facing a central portion of the base substrate. The inner surface of the blocking barrier and the convex patterns contact the adhesive material.

20 Claims, 11 Drawing Sheets

FIG. 5
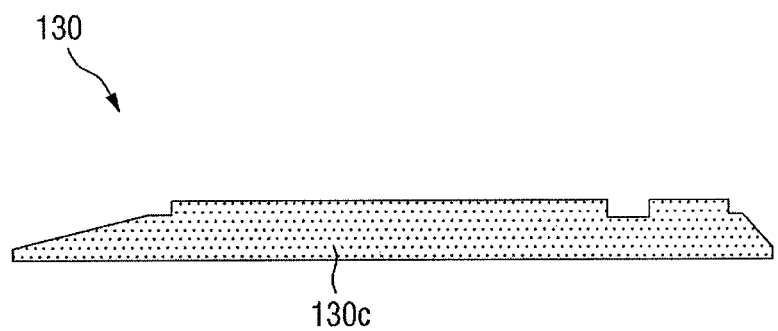
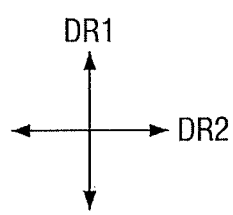
FIG. 6
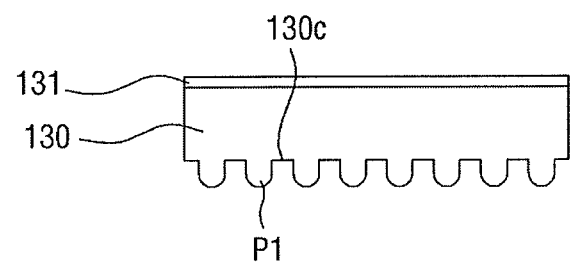
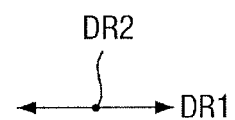

FIG. 7
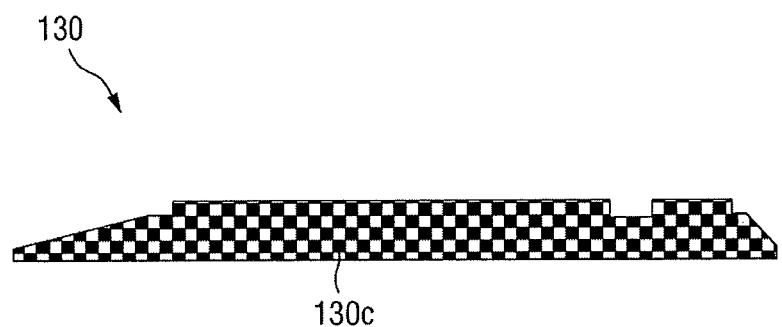
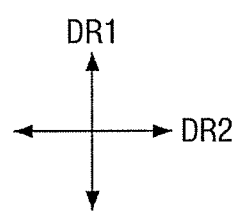
FIG. 8
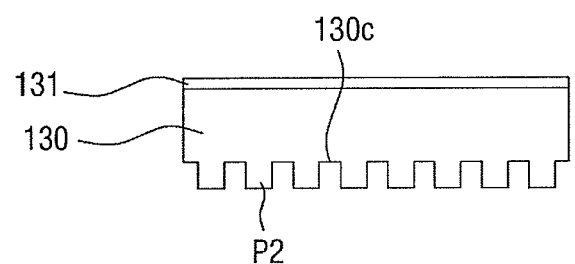
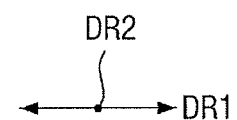

FIG. 9
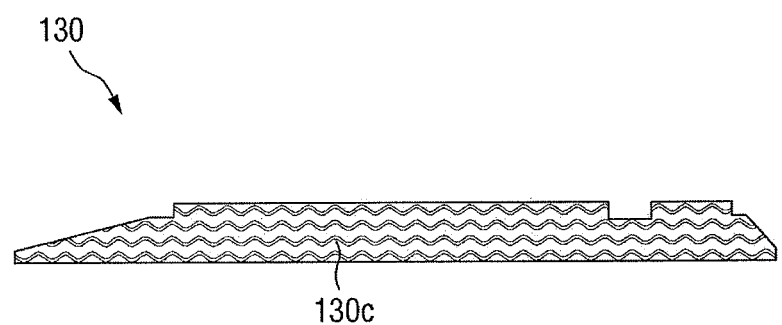
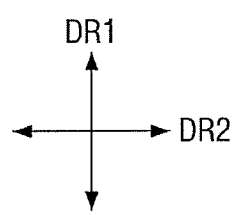
FIG. 10
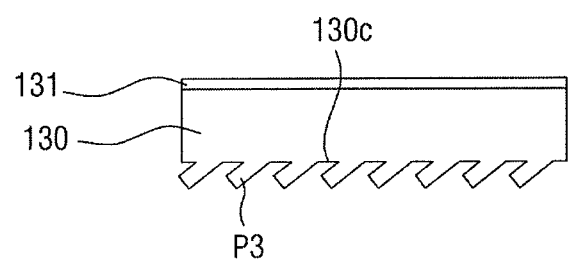
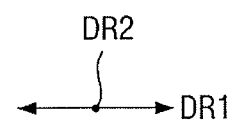

US 10,347,864 B2

DISPLAY DEVICE

CROSS-REFERENCE TO RELATED APPLICATION

Korean Patent Application No. 10-2017-0002479, filed on Jan. 6, 2017, and entitled, "Display Device," is incorporated by reference herein in its entirety.

BACKGROUND

1. Field

One or more embodiments described herein relate to a display device.

2. Description of the Related Art

A variety of electronic devices are equipped with a display. Examples include televisions, monitors, notebooks, tablet PCs, smart phones, and mobile phones. In these device, a window may be provided to protect the display screen from external impact or other environmental conditions. If the display includes a touch function, the window may be especially useful.

According to one arrangement, the window is attached to a display panel by an adhesive member. However, the adhesive member may be in a fluid state before it is sufficiently cured or an excessive amount of adhesive may be applied that flows over to another area inside the display device. As a result, the display may have a defect.

SUMMARY

In accordance with one or more embodiments, a display device includes a display panel including a display area and a non-display area; a window on the display panel; an adhesive material between the display panel and the window, wherein the window includes: a base substrate which includes a first area overlapping the display area, a second area overlapping the non-display area, and a third area protruding outwardly from the display panel; and a blocking barrier on the second area of the base substrate, the blocking barrier including convex patterns and an inner surface facing a central portion of the base substrate, the inner surface of the blocking barrier and the convex patterns contacting the adhesive material.

The blocking barrier may be separated from a boundary by a predetermined distance, the boundary between the first area and the second area. The blocking barrier may have a first length in a first direction, and the first length may be equal to a width of the display panel in the first direction.

The display device includes a flexible printed circuit board (FPCB) overlapping the non-display area and contacting an upper surface of the display panel, wherein the blocking barrier includes an area overlapping the FPCB and wherein the convex patterns contact the FPCB. The FPCB may be on a side of the display panel, and the blocking barrier may be on a side of the window which corresponds to the side of the display panel.

The blocking barrier may include an outer surface opposite the inner surface, wherein the outer surface includes a portion protruding toward the third area in the area overlapping the FPCB. An outer surface of the display panel may be substantially aligned with the outer surface of the blocking barrier in the protruding portion.

The display device may include a light-shielding pattern layer between the base substrate and the blocking barrier, and the light-shielding pattern layer may be over the second area and the third area. The blocking barrier may be thicker than the light-shielding pattern layer.

In accordance with one or more other embodiments, a display device includes a display panel including a display area and a non-display area; a touch panel on the display panel; a window on the touch panel; and an adhesive material between the touch panel and the window, wherein the window includes: a base substrate including a first area overlapping the display area, a second area overlapping the non-display area, and a third area protruding outwardly from the display panel; and a blocking barrier on the second area of the base substrate and including convex patterns on a lower surface, wherein the blocking barrier includes an inner surface facing a central portion of the base substrate and wherein the inner surface of the blocking barrier and the convex patterns contact the adhesive material.

The display device may include a first flexible printed circuit board (FPCB) overlapping the non-display area and contacting an upper surface of the touch panel; and a second FPCB overlapping the non-display area and contacting an upper surface of the display panel, wherein the convex patterns contact the first FPCB. The first FPCB may be on a side of the touch panel, and the blocking barrier may be on a side of the window which corresponds to the side of the touch panel.

The display device may include a first overlap area in which the blocking barrier overlaps the first FPCB; and a second overlap area in which the blocking barrier overlaps the second FPCB, wherein, in the first overlap area and the second overlap area, an outer surface of the blocking barrier located opposite the inner surface of the blocking barrier a portion protruding toward the third area. An outer surface of the display panel may be substantially aligned with the outer surface of the blocking barrier in the protruding portion.

In accordance with one or more other embodiments, a display device includes a display panel includes a display area and a non-display area; a window on the display panel; a button driving portion on the window; and an adhesive material between the display panel and the window, wherein the window includes: a base substrate including a first area overlapping the display area, a second area overlapping the non-display area, and a third area protruding outwardly from the display panel; and a blocking barrier on the second area of the base substrate and including convex patterns on a lower surface, wherein the blocking barrier includes an inner surface facing a central portion of the base substrate, the inner surface of the blocking barrier and the convex patterns contact the adhesive material, and the button driving portion is on the third area.

The blocking barrier may be separated from a boundary, between the first area and the second area toward the third area, by a predetermined distance. The blocking barrier has a first length in a first direction, and the first length may be equal to a width of the display panel in the first direction. The display device may include a first FPCB which overlaps the non-display area and contacts an upper surface of the display panel; and a second FPCB on the third area and forms the button driving portion, wherein the first FPCB overlaps the blocking barrier and wherein the second FPCB does not overlap the blocking barrier.

The blocking barrier may include an outer surface located opposite the inner surface, and the outer surface may include a portion protruding toward the third area in an area overlapping the first FPCB. An outer surface of the display panel may be substantially aligned with the outer surface of the blocking barrier in the protruding portion.

BRIEF DESCRIPTION OF THE DRAWINGS

Features will become apparent to those of skill in the art by describing in detail exemplary embodiments with reference to the attached drawings in which:

FIG. 5 illustrates an embodiment of a blocking member;

FIG. 6 illustrates an embodiment of a cross-sectional view of the blocking member;

FIGS. 7 to 10 illustrate embodiments of shapes of the blocking member;

DETAILED DESCRIPTION

Figure 1:
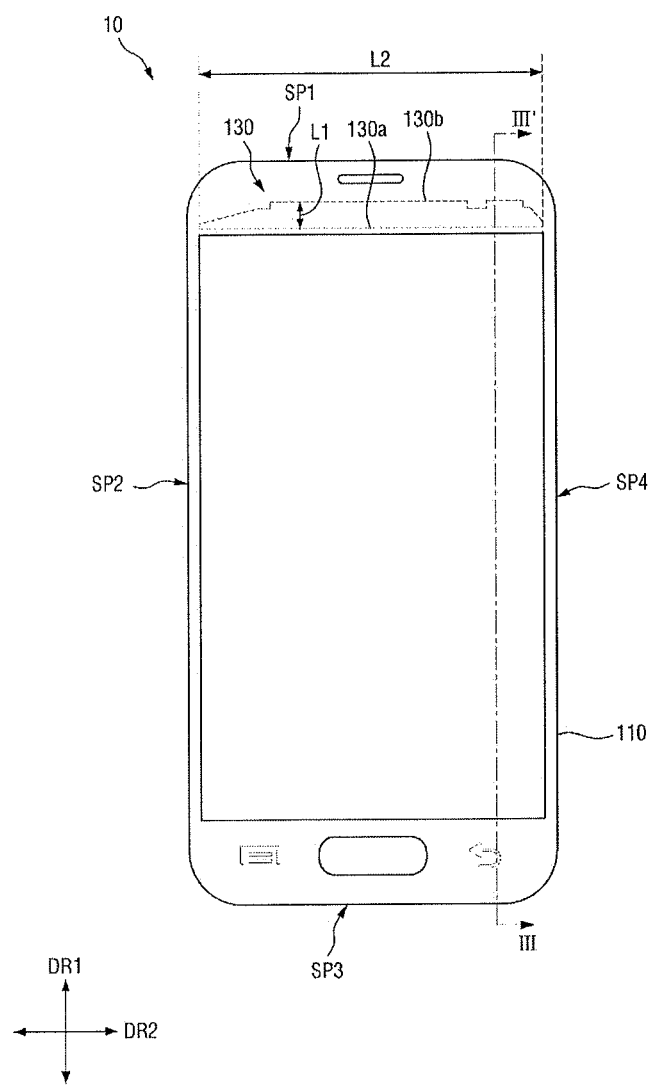
FIG. 1 illustrates an embodiment of a display device.

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 2:
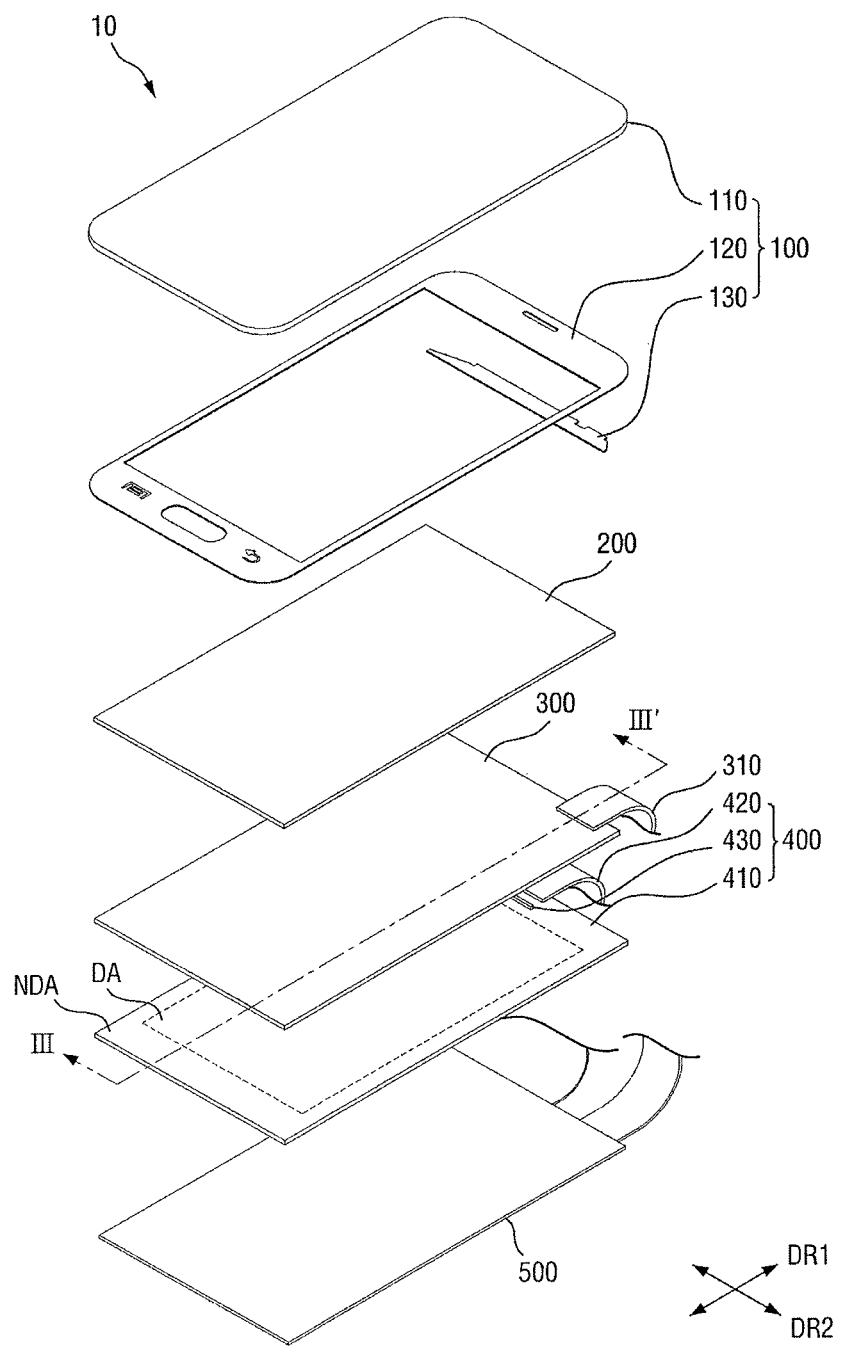
FIG. 2 illustrates an exploded view of the display device.
Figure 3:
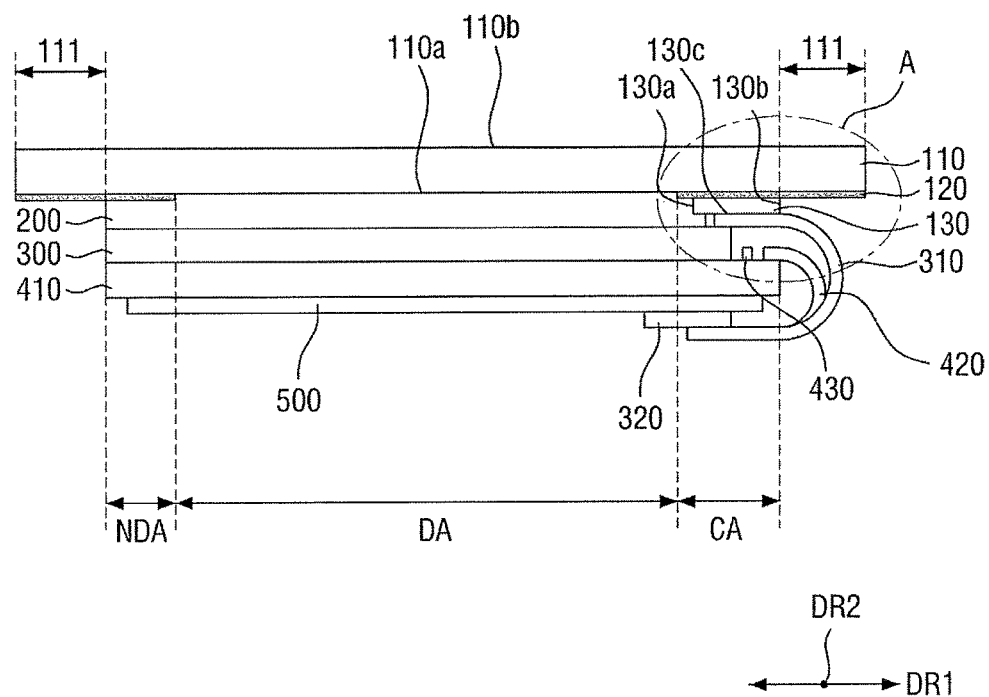
FIG. 3 illustrates a cross-sectional view taken along line in FIG. 1.

FIG. 1 illustrates a plan view of an embodiment of a display device 10. FIG. 2 illustrates an example of an exploded perspective view of the display device 10 of FIG. 1. FIG. 3 illustrates an example of a cross-sectional view along line of FIG. 1.

Referring to FIGS. 1 through 3, the display device 10 may include a display panel assembly 400 having a display area DA and a non-display area NDA, a touch panel 300 on and facing the display panel assembly 400, a window 100 on and facing the touch panel 300, and an adhesive member (or material or layer) 200 between the window 100 and the touch panel 300. The adhesive member bonds the window 100 and the touch panel 300 together. The display device 10 may further include a buffer member (or layer) 500 under the display panel assembly 400.

The display device 10 has a predetermined shape, e.g., a quadrilateral shape, in plan view. In one embodiment, illustrated in FIG. 2, the display device 10 may have a shape in the form of a substantially rectangular column with a total of four sides. The side to which flexible printed circuit boards (FPCBs) 310 and 420 are attached may be a first side SP1. A side opposite the first side SP1 may be a third side SP3. The left and right sides may be a second side SP2 and a fourth side SP4, respectively.

The display panel assembly 400 may include a display panel 410 which displays an image, a driving chip 430 which drives the display panel 410, and a first FPCB 420. The first FPCB 420 may be attached to the first side SP1 of the display panel 410. The driving chip 430 may be mounted on the display panel 410 in a vicinity of the first side SP1 of the display panel 410. In one embodiment, and the driving chip 430 may also be mounted on the first FPCB 420 or on another circuit board.

The display panel 410 may be, but is not limited to, a self-luminous display panel such as an organic light emitting device (OLED) panel or a non-luminous display panel such as a liquid crystal display (LCD) panel, an electrophoretic display (EPD) panel or electrowetting display (EWD) panel. In the current embodiment, the display panel 410 is an OLED panel.

The display panel 410 may include first and second substrates and a plurality of organic light emitting elements on the first substrate. The second substrate is separated from the first substrate and covers and protects the organic light emitting elements. In one embodiment, instead of the second substrate, a thin-film encapsulating layer including an inorganic film, an organic-inorganic hybrid film, or an organic/inorganic film laminate may also be applied to seal the organic light emitting elements.

The display panel 410 may include the display area DA to display an image and the non-display area NDA which displays no image. A portion of the non-display area NDA to which a circuit board is coupled may be referred to as a circuit area CA.

An area in which the first FPCB 420 and the driving chip 430 are disposed may be defined on the first side SP1 of the display panel 410. A side of the first FPCB 420 is attached to an upper surface of the display panel 410 on the first side SP1 and bent along a side surface of the display panel 410. The other side of the first FPCB 420 is attached to another printed circuit board (PCB) and disposed on a lower surface of the buffer member 500 together with the PCB. For example, a side of the first FPCB 420 may be bent as it is attached to the upper surface of the display panel 410. The other side of the first FPCB 420 may be on the lower surface of the buffer member 500. The PCB may be coupled to the buffer member 500, e.g., by double-sided tape.

The buffer member 500 is under the display panel 410 to mitigate external impact to the display panel 410. The buffer member 500 may include, for example, a protective film and cushion tape.

The touch panel 300 may be on the display panel 410, and the window 100 may be on the touch panel 300. In one embodiment, the touch panel 300 may be omitted. In this case, the window 100 is on the display panel 410.

The touch panel 300 may have a smaller area than the display panel 410 and may expose part of the display panel 410 on the first side SP1. A portion of the display panel 410 which does not overlap the touch panel 300 may be the area which includes the first FPCB 420 and the driving chip 430. The touch panel 300 may be, for example, as a capacitive type touch panel, a resistive film type touch panel, an ultrasonic type touch panel, or an infrared type touch panel.

A pad portion and the second FPCB 310 are attached to the first side SP1 of the touch panel 300. A side of the second FPCB 310 is coupled to an upper surface of the touch panel 300 and bent toward the lower surface of the buffer member 500. The other side of the second FPCB 310 may be attached to a first PCB 320 and on the lower surface of the buffer member 500 with the first PCB 320. For example, a side of the second FPCB 310 may be bent as it is coupled to the upper surface of the touch panel 300. The other side of the second FPCB 310 may be on the lower surface of the buffer member 500. The first PCB 320 may be coupled to the buffer member 500, e.g., by double-sided tape.

The first FPCB 420 and the second FPCB 310 may not overlap each other in a plan view. For example, the sum of a width of the first FPCB 420 and a width of the second FPCB 310 may be less than or equal to a width of the display panel 410. In addition, the first FPCB 420 may be close to the second side SP2, and the second FPCB 310 may be close to the fourth side SP4. In one embodiment, the width of the second FPCB 310 may be equal to the width of the first FPCB 420, and the second FPCB 310 may overlap the first FPCB 420 in a plan view.

The adhesive member 200 is between the window 100 and the touch panel 300 and bonds the window 100 and the touch panel 300 together. The adhesive member 200 may have a composition that includes an optically clear resin (OCR) or an optically clear adhesive (OCA). The current embodiment describes the illustrative case where an optically clear resin is used as the composition of the adhesive member 200. The optically clear resin may be an adhesive composition before being cured and may have fluidity.

The adhesive member 200 may prevent the formation of an air gap between the touch panel 300 and the window 100 and may prevent foreign matter (e.g., dust) from being introduced between the touch panel 300 and the window 100. Therefore, the adhesive member 200 may be sufficiently disposed so that no empty space is formed between the touch panel 300 and the window 100.

The window 100 is on the touch panel 300 and may include a base substrate 110, a blocking member (or barrier) 130 on the base substrate 110, and a light-shielding pattern layer 120 between the base substrate 110 and the blocking member 130. The base substrate 110 protects the touch panel 300 and the display panel 410 from external impact. The base substrate 110 may include a transparent material, e.g., glass or resin.

The base substrate 110 may have a shape corresponding to the shape of the display panel 410. For example, the base substrate 110 may have a rectangular shape in a plan view. The base substrate 110 may be larger than the display panel 410. In an embodiment, each side of the base substrate 110 may be larger than a corresponding side of the display panel 410 on the first, second, third, and fourth sides SP1, SP2, SP3 and SP4. The base substrate 110 may cover the whole of the touch panel 300 and the display panel 410. Each side of the base substrate 110 may protrude outwardly from a corresponding side of display panel 410 on the first side SP1 and the third side SP3.

The base substrate 110 includes a first surface 110a facing the display panel 410 and a second surface 110b opposite the first surface 110a. The light-shielding pattern layer 120 may be on the first surface 110a of the base substrate 110. In one embodiment, the light-shielding pattern layer 120 may also be on the second surface 110b of the base substrate 110.

The light-shielding pattern layer 120 overlaps and corresponds to part of the non-display area NDA of the display panel 410. The light-shielding pattern layer 120 may not overlap the display area DA of the display panel 410.

In an embodiment, the light-shielding pattern layer 120 may overlap the entire non-display area NDA of the display panel 410. The light-shielding pattern layer 120 may not only cover an area of the base substrate 110 which overlaps the non-display area NDA of the display panel 410, but may also cover the entirety of a protruding area 111 of the base substrate 110 which protrudes outwards from an outer surface of the display panel 410. For example, the light-shielding pattern layer 120 may be on an area where the non-display area NDA of the display panel 410 overlaps the base substrate 110 and on the protruding area 111 of the base substrate 110.

The light-shielding pattern layer 120 prevents light from being emitted to an area other than the display area DA of the display device 10, and may give the bezel of the display device 10 a color appearance. The light-shielding pattern layer 120 may include an opaque material. For example, the light-shielding pattern layer 120 may include black pearl, blue coral, silver titanium, gold platinum, white pearl, or another colored material. The color of light-shielding pattern layer 120 may be recognized by a user as the color of the frame of the screen and may aesthetically appeal to the user.

The light-shielding pattern layer 120 may be formed, for example, by coating a color ink on the base substrate 110. In one embodiment, the light-shielding pattern layer 120 may be formed as a film, which is then attached to the base substrate 110 using an adhesive member. In another embodiment, a different method may be used to form the light-shielding pattern layer 120. The light-shielding pattern layer 120 may have a predetermined thickness, e.g., 10 μm to 30 μm.

The blocking member 130 may be on a lower surface of the light-shielding pattern layer 120. When the light-shielding pattern layer 120 is on the second surface 110b of the base substrate 110, the blocking member 130 may be directly attached to the first surface 110a of the base substrate 110.

The blocking member 130 may be on the first side SP1 on which the second FPCB 310 is disposed. In one embodiment, the blocking member 130 may also be formed on another side. The blocking member 130 may extend in a longitudinal direction along the first side SP1 within a range that overlaps the circuit area CA of the display panel 410. The blocking member 130 may overlap part of the circuit area CA of the display panel 410, but may not overlap the display area DA of the display panel 410 and the protruding area 111 of the base substrate 110.

In an embodiment, the blocking member 130 may be separated from the boundary between the display area DA and the circuit area CA by a predetermined distance. For example, a relatively inner surface 130a of the blocking member 130 may be separated outwardly from the boundary between the display area DA and the circuit area CA by a predetermined distance. A relatively outer surface 130b of the blocking member 130 may be substantially aligned with an end of the display panel 410.

Referring to FIG. 1, the blocking member 130 may have a shape corresponding to the first FPCB 420 and the second FPCB 310 in a plan view. In one embodiment, in an area in which the blocking member 130 overlaps the first and second FPCBs 420 and 310, the outer surface 130b of the blocking member 130 may include a portion relatively protruding toward the protruding area 111. In the protruding portion, the outer surface 130b of the blocking member 130 and the end of the display panel 410 may be substantially aligned with each other. For example, an area in which the outer surface 130b of the blocking member 130 and the end of the display panel 410 may be substantially aligned with each other and may be an area in which the blocking member 130 corresponds to the second FPCB 310 and/or the first FPCB 420.

When the blocking member 130 has a first length L1 in a first direction DR1 in a plan view, the first length L may be greatest in the area in which the blocking member 130 overlaps the first FPCB 420 and the second FPCB 310. The first length L1 of the blocking member 130 may be relatively smallest at both ends of a second direction DR2 intersecting the first direction DR1. The first length L1 may gradually increase from both ends of the blocking member 130 toward the area in which the blocking member 130 overlaps the FPCBs 310 and 420.

The blocking member 130 may have a second length L2 in the second direction DR2. The second length L2 may be substantially the same as the width of the display panel 410 in the second direction DR2. The blocking member 130 may be, for example, a resin film made of acrylic, PC, PET or the like. The blocking member 130 may have a predetermined thickness, e.g., about 50 μm.

An embodiment of the first side SP1 of the display device 10 will now be described in greater detail with reference to FIGS. 4 to 6.

Figure 4:
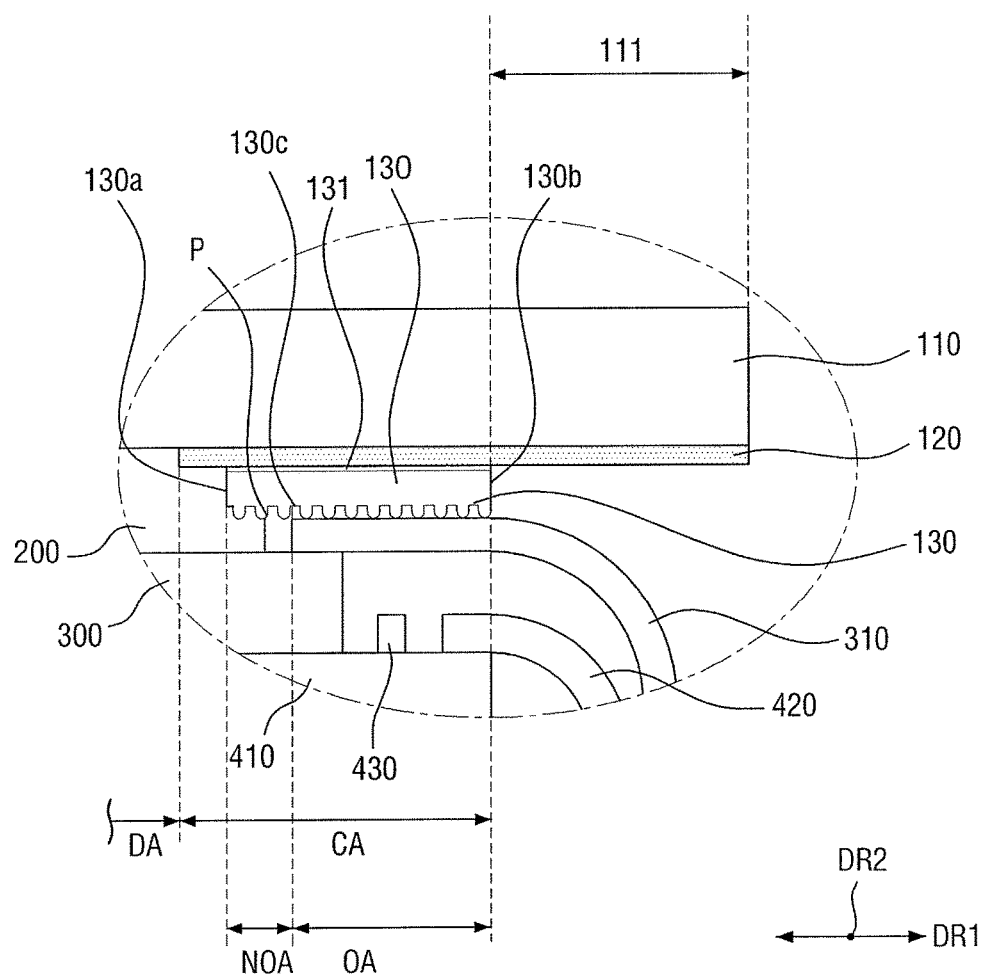
FIG. 4 illustrates an enlarged view of an area A in FIG. 3.

FIG. 4 illustrates an embodiment of an enlarged view of an area 'A' of FIG. 3. FIG. 5 illustrates an embodiment of a bottom view of a blocking member 130. FIG. 6 illustrates an embodiment of a cross-sectional view of the blocking member 130.

The blocking member 130 includes an overlap area OA which overlaps the second FPCB 310 and a non-overlap area NOA which does not overlap the second FPCB 310. The overlap area OA may be a predetermined percentage (e.g., about 50% or more) of the entire area of the blocking member 130. In one embodiment, the non-overlap area NOA may be located further in than the overlap area OA. In the non-overlap area NOA, the blocking member 130 may directly face touch panel 300.

An adhesive layer 131 may be formed on an upper surface of the blocking member 130, which is in contact with the light-shielding pattern layer 120. The blocking member 130 may be attached to the light-shielding pattern layer 120 without an adhesive member. However, when the adhesive layer 131 is not formed, an adhesive member may be, for example, between the light-shielding pattern layer 120 and the blocking member 130.

Unlike the upper surface of the blocking member 130, a lower surface 130c of the blocking member 130 may not have an adhesive layer. In one embodiment, an adhesive layer may be on the lower surface 130c of the blocking member 130.

Convex patterns P may be formed on the lower surface 130c of the blocking member 130. Referring to FIGS. 5 and 6, the convex patterns P may include a plurality of hemispherical dot patterns P1. The dot patterns P1 may protrude from the lower surface 130c of the blocking member 130 toward the second FPCB 310.

In the overlap area OA, the dot patterns P1 may contact an upper surface of the second FPCB 310. For example, most of the dot patterns P1 may contact the upper surface of the second FPCB 310 in the overlap area OA. In one embodiment, the dot patterns P1 may not contact the upper surface of the second FPCB 310 in an area in which the second FPCB 310 is curved.

Due to the dot patterns P1, the lower surface 130c of the blocking member 130 may be separated from the second FPCB 310 by a predetermined distance. In one embodiment, the lower surface 130c of the blocking member 130 may also be brought into contact with the second FPCB 310, for example, by external pressure.

In the non-overlap area NOA, the lower surface 130c of the blocking member 130 and some of the dot patterns P1 may contact the adhesive member 200. The adhesive member 200 may be formed up to a position that is spaced apart from a boundary, between the non-overlap area NOA and the overlap area OA toward the non-overlap area NOA, by a predetermined distance. However, since the adhesive composition that forms the adhesive member 200 may have fluidity, some of the uncured adhesive composition may overflow into the overlap area OA. For example, the uncured adhesive composition may flow to an area between the blocking member 130 and the second FPCB 310 and may fill a space between the lower surface 130c of the blocking member 130 and the dot patterns P1 in the overlap area OA.

The blocking member 130 prevents the light-shielding pattern layer 120 from contacting the uncured adhesive composition and reduces the overflow distance of the uncured adhesive composition in the overlap area OA. Since the convex patterns P on the blocking member 130 interfere with the flow of the uncured adhesive composition, the convex patterns P may be very effective in reducing the overflow distance. For example, the uncured adhesive composition should fill each empty space between the convex patterns P. In addition, when the convex patterns P have a larger surface area than flat patterns, the surface tension of the adhesive composition may prevent the uncured adhesive composition from overflowing.

The uncured adhesive composition may form stains on the light-shielding pattern layer 120 and/or may cause defects in the display device 10 by contaminating other components. For example, it may be relatively difficult to clean the uncured adhesive composition on the side where the FPCBs 310 and 420 are formed. Therefore, the display device 10 is highly likely to have defects due to the uncured adhesive composition. However, when contact between the adhesive member 200 and the light-shielding pattern layer 120 and the overflow of the adhesive member 200 are prevented using the blocking member 130 as in the current embodiment, the defect rate of the display device 10 may be reduced.

In order to experimentally confirm the effect of the blocking member 130 in suppressing overflow of the adhesive member 200, two windows including a light-shielding pattern layer with a thickness of 25 μm and a blocking member with a thickness of 50 μm, and a touch panel having an FPCB on a side, were prepared. As a comparative example, no shape was formed on a lower surface of the blocking member. As an embodiment, dot-shaped convex patterns were formed on the lower surface of the blocking member Each blocking member was placed on a base substrate constituting a corresponding window in an embodiment.

An optically clear resin was applied to the entire surface of each window. Then, each window and the touch panel were laminated so that the FPCB contacted the lower surface of the blocking member. After lamination, the optically clear resin having fluidity was cured and hardened. Then, the degrees of discoloration of the light-shielding pattern layers due to overflow of the optically clear resin were compared in order to check the probability of overflow of uncured optically clear resin after the curing process.

The comparison result indicated that when the convex patterns were not formed, the discoloration probability of the light-shielding pattern layer increased by 2.38% or more as compared with when the convex patterns were formed. Therefore, it can be seen that the embodiment in which the convex patterns are formed on the lower surface of the blocking member is effective in preventing the overflow of the optically clear resin.

FIGS. 7 to 10 illustrate bottom and cross-sectional views illustrating shapes of the blocking member 130 according to various embodiments. Referring to FIGS. 7 and 8, the convex patterns P may be quadrilateral patterns P2 arranged in the form of a grid. In FIG. 7, the width of a protruding portion is the same as a width of the non-protruding portion. In one embodiment, the width of the protruding portion and the width of the non-protruding portion may be different.

Referring to FIGS. 9 and 10, the convex patterns P may be wave patterns P3. In FIG. 9, the wave patterns P3 extend along the second direction DR2 and are arranged in the first direction DR1. The wave patterns P3 may be in a different direction or have a different arrangement in another embodiment.

In FIGS. 5 to 10, example shapes of the convex patterns P are illustrated. The shapes of the convex patterns P may be different in another embodiment. For example, the convex patterns P may have various other shapes (including but not limited to an elliptical shape, a triangular shape, a polygonal shape and a simple closed curve shape) as long as they suppress the flow of the uncured adhesive composition. The size, structure, spacing, etc., of the shapes may vary among embodiments.

The display device 10 may not include the touch panel 300 and the second FPCB 310. In this case, the adhesive member 200 may be between the window 100 and the display panel 410. The convex patterns P on the lower surface 130c of the blocking member 130 may contact an upper surface of the first FPCB 420. In some circumstances, it may be difficult to clean the uncured adhesive composition on the side where the first FPCB 420 is formed as described above. Thus, defects of the display device 10 may be reduced by suppressing the overflow of the uncured adhesive composition using the blocking member 130.

Figure 11:
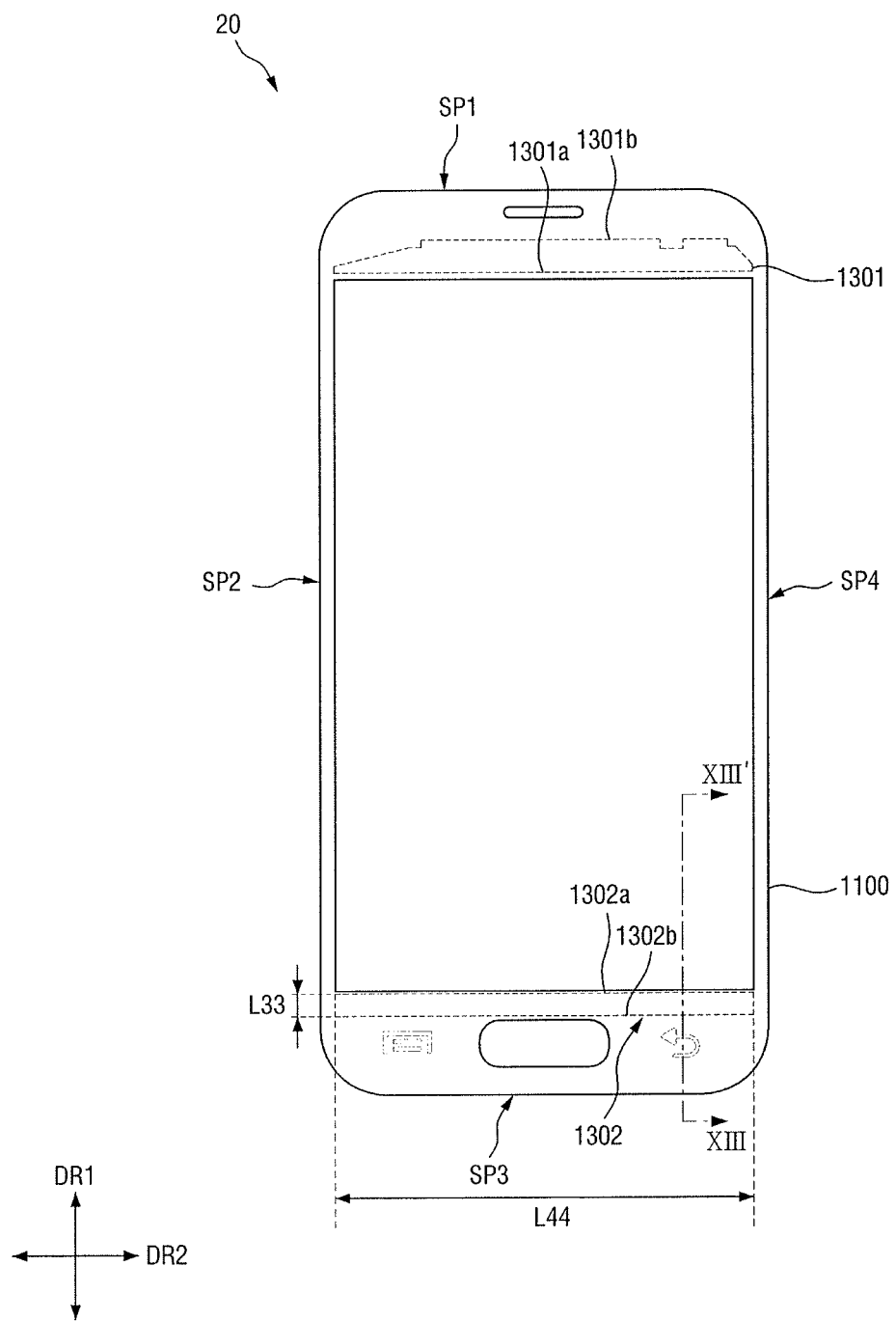
FIG. 11 illustrates another embodiment of a display device.
Figure 12:
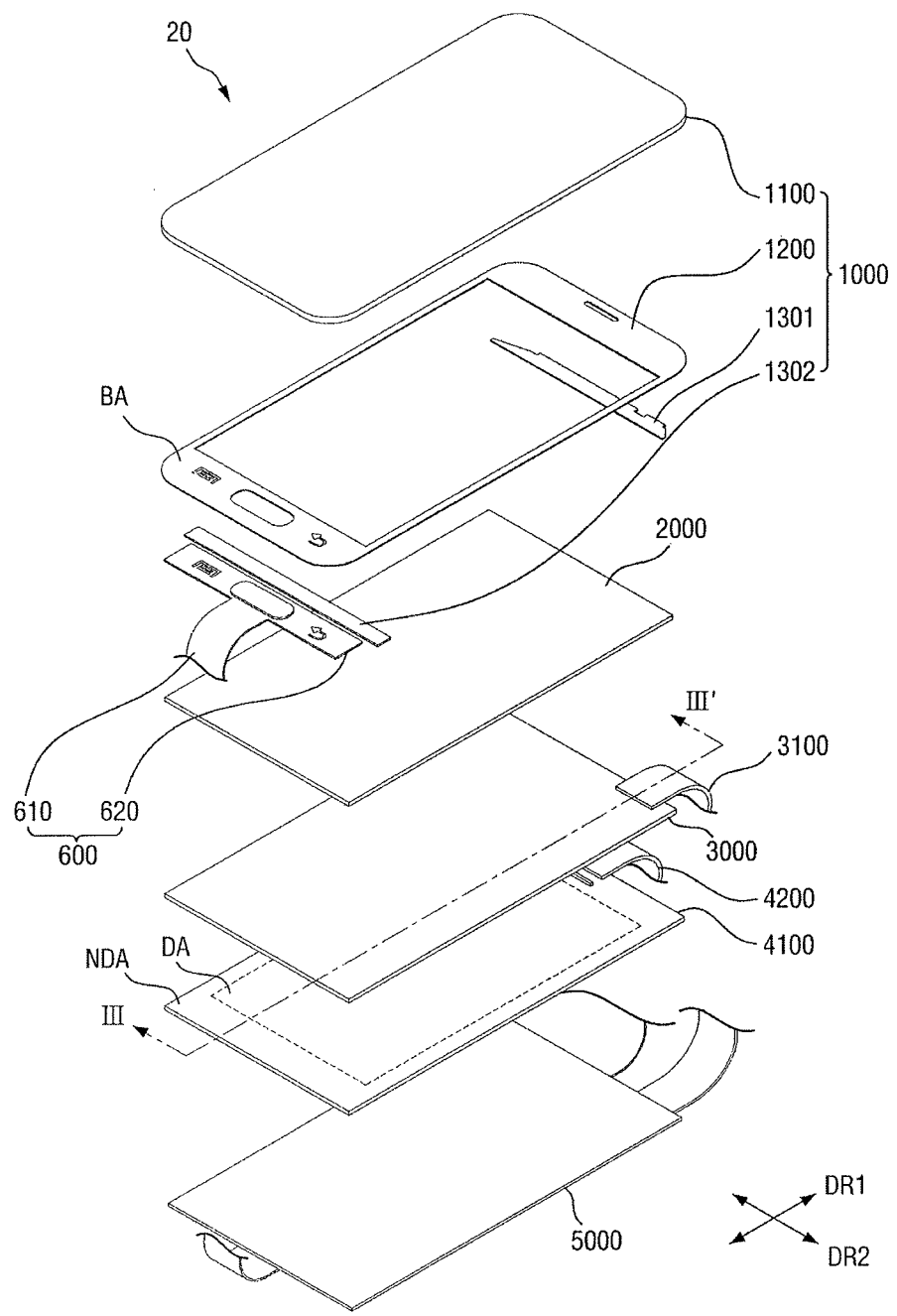
FIG. 12 illustrates an exploded view of the display device of FIG. 11.
Figure 13:
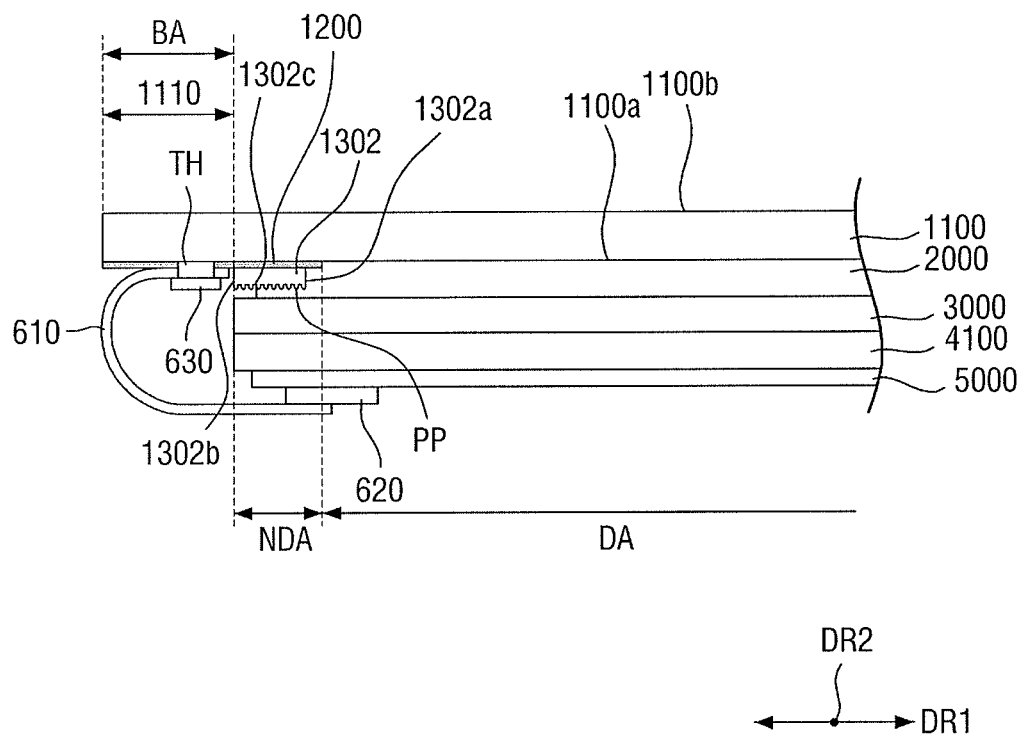
FIG. 13 illustrates a cross-sectional view taken along line XIII-XIII' in FIG. 12.

FIG. 11 illustrates a plan view of another embodiment of a display device. FIG. 12 illustrates an exploded perspective view of the display device of FIG. 11. FIG. 13 illustrates a cross-sectional view taken along line in FIG. 12.

The display device 20 may include a button area BA formed along a side of a window 1000, in addition to a display panel 4100, a touch panel 3000, the window 1000, and an adhesive member 2000. Buttons for driving the display device 20 are formed in the button area BA. In FIGS. 11 through 13, the button area BA is formed along a third side SP3. In another embodiment, the button area BA may also be formed on a first side SP1.

Referring to FIGS. 11 to 13, the button area BA may be formed in substantially the same area as a protruding area 1110 of the window 1100 on the third side SP3. In one embodiment, the button area BA may include part of a non-display area NDA in addition to the protruding area 1110.

A base substrate 1100 includes a first surface 1100a facing the display panel 4100 and a second surface 1100b opposite the first surface 1100a. A light-shielding pattern layer 1200 may be on the first surface 1100a of the base substrate 1100. In one embodiment, the light-shielding pattern layer 1200 may also be on the second surface 1100b of the base substrate 1100.

The light-shielding pattern layer 1200 may be in an area of the window 1000 which overlaps the non-display area NDA of the display panel 4100. Further, the light-shielding pattern layer 1200 may overlap the button area BA to correspond to the button area BA.

A button driving portion 600 may be on a lower surface of the light-shielding pattern layer 1200 in the button area BA. The button driving portion 600 may include a touch sensor, a third FPCB 610 which is electrically connected to the touch sensor, a second PCB 620 which is connected to the third FPCB 610, and a light emitting unit 630 which enables the button area BA to be recognized from the outside.

The touch sensor may be attached to or separated from the lower surface of the light-shielding pattern layer 1200. When a user touches the button area BA of the window 1000 corresponding to the position of the touch sensor, the touch sensor may sense the touch and transmit an electrical signal to the third FPCB 610.

A side of the third FPCB 610 is attached to the lower surface of the light-shielding pattern layer 1200 and bent along the side surfaces of the touch panel 3000 and the display panel 4100. Another side of the third FPCB 610 is attached to the second PCB 620 and on a lower surface of a buffer member 5000 with the second PCB 620. For example, the third FPCB 610 is bent at the same time as when it is attached to the lower surface of the light-shielding pattern layer 1200, and is placed on the lower surface of the buffer member 5000.

In the button area BA, a transmission hole TH recognizable from the outside may be formed in the light-shielding pattern layer 1200 and the third FPCB 610.

The third FPCB 610 may include a surface contacting the light-shielding pattern layer 1200 on a side and a surface opposite the surface contacting the light-shielding pattern layer 1200. The light emitting unit 630 may be attached to the other surface of the third FPCB 610. The light emitting unit 630 may be substantially aligned with the transmission hole TH. The light emitting unit 630 may have the same width and shape as the transmission hole TH or may be different from (e.g., larger than) the transmission hole TH. The light emitting unit 630 emits light out of the window 1100 through the transmission hole TH, so that the button area BA may be recognized from the outside.

Blocking members 1301 and 1302 may be attached to the lower surface of the light-shielding pattern layer 1200. The blocking members 1301 and 1302 may be on the first side SP1 where a first FPCB 3100 is disposed and on the third side SP3 where the third FPCB 610 is disposed. In one embodiment, the blocking members 1301 and 1302 may also be formed on one or more other sides. The first blocking member 1301 may have the same features as the blocking member 130 of the display device 10 according to the above-described embodiment.

Referring to FIG. 13, the second blocking member 1302 may be attached to the lower surface of the light-shielding pattern layer 1200. When the light-shielding pattern layer 1200 is on the second surface 1100b of the base substrate 1100, the second blocking member 1302 may be directly attached to the first surface 1100a of the base substrate 1100.

The second blocking member 1302 may be on the third side SP3 where the third FPCB 610 is disposed. The second blocking member 1302 may extend along the third side SP3 in a longitudinal direction within a range that overlaps the non-display area NDA of the display panel 4100. The second blocking member 1302 may be separated from a boundary between the non-display area NDA and a display area DA by a predetermined distance. For example, a relative inner surface 1302a of the second blocking member 1302 may be separated outwards from the boundary between the display area DA and the non-display area NDA by a predetermined distance. A relative outer surface 1302b of the second blocking member 1302 may be substantially aligned with an end of the display panel 4100.

Referring to FIG. 11, the outer surface 1302b of the second blocking member 1302 may be substantially shaped like a straight light in a plan view, unlike an outer surface 1301b of the first blocking member 1301. For example, the outer surface 1302b of the second blocking member 1302 may not have a relatively more protruding or recessed portion. In one embodiment, edges of the outer surface 1302b at ends of the second blocking member 1302 may be formed in a curved shape.

In a plan view, the second blocking member 1302 may have a third length L33 in a first direction DR1 and a fourth length L44 in a second direction DR2 intersecting the first direction DR1. The fourth length L44 may be substantially the same as the width of the display panel 4100 in the second direction DR2.

An adhesive layer may be formed on an upper surface of the second blocking member 1302 which contacts the light-shielding pattern layer 1200, so that the upper surface of the second blocking member 1302 becomes adhesive. In this case, the second blocking member 1302 may be attached to the light-shielding pattern layer 1200 without an adhesive member. In one embodiment, when the adhesive layer is not formed, the light-shielding pattern layer 1200 and the second blocking member 1302 may be bonded together by an adhesive member.

Convex patterns PP may be formed on a lower surface 1302c of the second blocking member 1302 which contacts an upper surface of the touch panel 3000. The convex patterns PP may be formed, for example, as hemispherical dot patterns P1, quadrilateral patterns P2 arranged in a grid form, or wave patterns P3 as described above with reference to FIGS. 5 to 10. In one embodiment, the convex patterns PP may have different or other shapes, including but not limited to an elliptical shape, a triangular shape, a polygonal shape, or a simple closed curve shape, as long as the shape(s) of the convex patterns PP suppress the flow of an uncured adhesive composition. The size, structure, spacing, etc., of the shapes may vary among different embodiments.

The convex patterns PP may be separated from the upper surface of the touch panel 3000 by a predetermined distance. For example, a space may be formed between the convex patterns PP and the upper surface of the touch panel 300. The space may be filled with the adhesive member 2000. Referring to FIG. 13, the adhesive member 2000 may fill the above space up to a position, separated inwards from the outer surface 1302b of the second blocking member 1302, by a predetermined distance in cross-section. In one embodiment, the adhesive member 2000 may also be substantially aligned with the outer surface 1302b or may be applied in any way as long as there is sufficient adhesion between the window 1100 and touch panel 3000.

As described above, the uncured adhesive composition may form stains on the light-shielding pattern layer 1200 and cause defects of the display device 20 by contaminating other members. In addition, it may be difficult to clean the uncured adhesive composition that flowed toward the button driving portion 600. However, when the convex patterns PP are formed on the lower surface 1302c of the second blocking member 1302 as in the current embodiment, overflow of the uncured adhesive composition may be suppressed, thereby preventing problems caused by overflow of the uncured adhesive composition.

Figure 14:
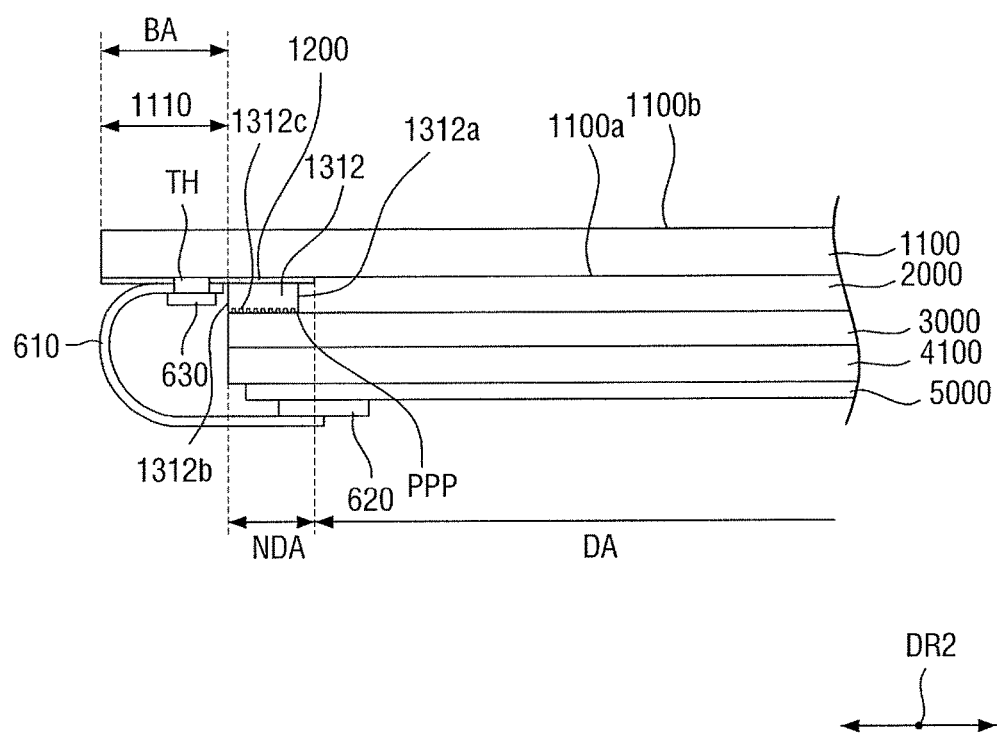
FIG. 14 illustrates another embodiment of a display device.

FIG. 14 illustrates a cross-sectional view of another embodiment of a display device. In this embodiment, convex patterns PPP formed on a lower surface 1312c of a second blocking member 1312 may contact an upper surface of a touch panel 3000. Due to the convex patterns PPP, the lower surface 1312c of the second blocking member 1312 may be separated from the upper surface of the touch panel 3000 by a predetermined distance. In one embodiment, the lower surface 1312c of the second blocking member 1312 may also be brought into contact with the upper surface of the panel 3000, for example, by external pressure.

When the convex patterns PPP and the upper surface of the touch panel 3000 contact each other, a space between the convex patterns PPP and the upper surface of the touch panel 3000 becomes small. Therefore, overflow of an uncured adhesive composition may be more effectively controlled.

In accordance with one or more of the aforementioned embodiments, overflow of an adhesive member may be effectively prevented or controlled by forming convex patterns on a lower surface of a blocking member. As a result, the defect rate of a display device may be reduced during manufacture.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A display device, comprising:
a display panel including a display area and a non-display area;
a window on the display panel;
an adhesive material between the display panel and the window, wherein the window includes:
a base substrate which includes a first area overlapping the display area, a second area overlapping the non-display area, and a third area protruding outwardly from the display panel; and
a blocking barrier on the second area of the base substrate, the blocking barrier including convex patterns and an inner surface facing a central portion of the base substrate, the inner surface of the blocking barrier and the convex patterns contacting the adhesive material.

2. The display device as claimed in claim 1, wherein the blocking barrier is separated from a boundary by a predetermined distance, the boundary between the first area and the second area.

3. The display device as claimed in claim 2, wherein:
the blocking barrier has a first length in a first direction, and
the first length is equal to a width of the display panel in the first direction.

4. The display device as claimed in claim 1, further comprising:
a flexible printed circuit board (FPCB) overlapping the non-display area and contacting an upper surface of the display panel, wherein the blocking barrier includes an area overlapping the FPCB and wherein the convex patterns contact the FPCB.

5. The display device as claimed in claim 4, wherein:
the FPCB is on a side of the display panel, and
the blocking barrier is on a side of the window which corresponds to the side of the display panel.

6. The display device as claimed in claim 4, wherein the blocking barrier includes:
an outer surface opposite the inner surface,
wherein the outer surface includes a protruding portion protruding toward the third area in the area overlapping the FPCB.

7. The display device as claimed in claim 6, wherein an outer surface of the display panel is aligned with the outer surface of the blocking barrier in the protruding portion.

8. The display device as claimed in claim 1, further comprising:
a light-shielding pattern layer between the base substrate and the blocking barrier, wherein the light-shielding pattern layer is over the second area and the third area.

9. The display device as claimed in claim 8, wherein the blocking barrier is thicker than the light-shielding pattern layer.

10. A display device, comprising:
a display panel including a display area and a non-display area;
a touch panel on the display panel;
a window on the touch panel; and
an adhesive material between the touch panel and the window,
wherein the window includes:
a base substrate including a first area overlapping the display area, a second area overlapping the non-display area, and a third area protruding outwardly from the display panel; and
a blocking barrier on the second area of the base substrate and including convex patterns on a lower surface, wherein the blocking barrier includes an inner surface facing a central portion of the base substrate and wherein the inner surface of the blocking barrier and the convex patterns contact the adhesive material.

11. The display device as claimed in claim 10, further comprising:
a first flexible printed circuit board (FPCB) overlapping the non-display area and contacting an upper surface of the touch panel; and
a second FPCB overlapping the non-display area and contacting an upper surface of the display panel, wherein the convex patterns contact the first FPCB.

12. The display device as claimed in claim 11, wherein:
the first FPCB is on a side of the touch panel, and
the blocking barrier is on a side of the window which corresponds to the side of the touch panel.

13. The display device as claimed in claim 11, further comprising:
a first overlap area in which the blocking barrier overlaps the first FPCB; and
a second overlap area in which the blocking barrier overlaps the second FPCB, wherein, in the first overlap area and the second overlap area, an outer surface of the blocking barrier located opposite the inner surface of the blocking barrier a protruding portion protruding toward the third area.

14. The display device as claimed in claim 13, wherein an outer surface of the display panel is aligned with the outer surface of the blocking barrier in the protruding portion.

15. A display device, comprising:
a display panel includes a display area and a non-display area;
a window on the display panel;
a button driving portion on the window; and
an adhesive material between the display panel and the window,
wherein the window includes:
a base substrate including a first area overlapping the display area, a second area overlapping the non-display area, and a third area protruding outwardly from the display panel; and
a blocking barrier on the second area of the base substrate and including convex patterns on a lower surface, wherein the blocking barrier includes an inner surface facing a central portion of the base substrate, the inner surface of the blocking barrier and the convex patterns contact the adhesive material, and the button driving portion is on the third area.

16. The display device as claimed in claim 15, wherein the blocking barrier is separated from a boundary, between the first area and the second area toward the third area, by a predetermined distance.

17. The display device as claimed in claim 16, wherein:
the blocking barrier has a first length in a first direction, and
the first length is equal to a width of the display panel in the first direction.

18. The display device as claimed in claim 15, further comprising:
a first FPCB which overlaps the non-display area and contacts an upper surface of the display panel; and
a second FPCB on the third area and forms the button driving portion,
wherein the first FPCB overlaps the blocking barrier and wherein the second FPCB does not overlap the blocking barrier.

19. The display device as claimed in claim 18, wherein:
the blocking barrier includes an outer surface located opposite the inner surface, and
the outer surface includes a protruding portion protruding toward the third area in an area overlapping the first FPCB.

20. The display device as claimed in claim 19, wherein an outer surface of the display panel is aligned with the outer surface of the blocking barrier in the protruding portion.

* * * * *